(12) United States Patent
Song et al.

(10) Patent No.: US 11,991,898 B2
(45) Date of Patent: May 21, 2024

(54) DISPLAY DEVICE

(71) Applicant: LG Display Co., Ltd., Seoul (KR)

(72) Inventors: JiHun Song, Seoul (KR); Hoiyong Kwon, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 423 days.

(21) Appl. No.: 17/481,111

(22) Filed: Sep. 21, 2021

(65) Prior Publication Data

US 2022/0209180 A1 Jun. 30, 2022

(30) Foreign Application Priority Data

Dec. 29, 2020 (KR) .................. 10-2020-0185745

(51) Int. Cl.
| | |
|---|---|
| *H10K 50/844* | (2023.01) |
| *B32B 3/04* | (2006.01) |
| *B32B 7/12* | (2006.01) |
| *B32B 27/32* | (2006.01) |
| *B32B 27/36* | (2006.01) |
| *H10K 50/86* | (2023.01) |
| *H10K 77/10* | (2023.01) |
| *H10K 102/00* | (2023.01) |

(52) U.S. Cl.
CPC .......... *H10K 50/844* (2023.02); *B32B 3/04* (2013.01); *B32B 7/12* (2013.01); *B32B 27/32* (2013.01); *B32B 27/36* (2013.01); *H10K 50/86* (2023.02); *H10K 77/111* (2023.02); *B32B 2307/42* (2013.01); *B32B 2307/7265* (2013.01); *B32B 2457/20* (2013.01); *H10K 2102/311* (2023.02)

(58) Field of Classification Search
CPC ..... H10K 50/844; H10K 77/111; H10K 50/86
See application file for complete search history.

(56) References Cited

U.S. PATENT DOCUMENTS

| | | | |
|---|---|---|---|
| 10,374,194 B2 * | 8/2019 | Son ...................... | H10K 59/131 |
| 2014/0217382 A1 * | 8/2014 | Kwon .................. | H10K 77/111 |
| | | | 257/40 |
| 2015/0036074 A1 * | 2/2015 | Park ........................ | G02B 5/30 |
| | | | 349/58 |
| 2020/0203642 A1 * | 6/2020 | Kim ...................... | B32B 15/043 |

FOREIGN PATENT DOCUMENTS

KR 10-2014-0104393 A 8/2014

* cited by examiner

*Primary Examiner* — Christine A Enad
(74) *Attorney, Agent, or Firm* — Birch, Stewart, Kolasch & Birch, LLP

(57) ABSTRACT

A display device according to an exemplary embodiment of the present disclosure can include a back cover, a display panel disposed on the back cover, a polarizing plate disposed on the display panel, a barrier film disposed on the polarizing plate, and a side film which has one end disposed between the back cover and the display panel and another end disposed between the polarizing plate and the barrier film to enclose side surfaces of the display panel and the polarizing plate. Therefore, the moisture permeation into the polarization layer is delayed, which in turn improves the reliability of the display device.

17 Claims, 6 Drawing Sheets

DISPLAY DEVICE

CROSS-REFERENCE TO RELATED APPLICATIONS

This application claims priority to Korean Patent Application No. 10-2020-0185745 filed on Dec. 29, 2020, in the Korean Intellectual Property Office, the entire contents of which are hereby expressly incorporated by reference into the present application.

BACKGROUND

Field

The present disclosure relates to a display device, and more particularly, to a rollable display device which is capable of reducing or minimizing a warpage of a display panel due to moisture.

Description of the Related Art

As display devices which are used for a monitor of a computer, a television, a cellular phone, or the like, there are an organic light emitting display device (OLED) which is a self-emitting device and a liquid crystal display device (LCD) which requires a separate light source.

An applicable range of the display device is diversified to personal digital assistants as well as monitors of computers and televisions and a display device with a large display area and a reduced volume and weight is being studied.

Recently, a rollable display device which is manufactured by forming a display unit and a wiring line on a flexible substrate such as plastic which is a flexible material, so as to be capable of displaying images even in a rolled state, is getting attention as the next generation display device.

SUMMARY OF THE DISCLOSURE

An object to be achieved by the present disclosure is to provide a display device which is capable of minimizing moisture permeation of a polarizing plate.

Another object to be achieved by the present disclosure is to provide a display device which is capable of minimizing moisture permeation through side surfaces of a display panel and a polarizing plate.

Still another object to be achieved by the present disclosure is to provide a display device which is capable of reducing or minimizing a warpage of a display panel which may be caused by the moisture permeation of the polarizing plate.

Still another object to be achieved by the present disclosure is to provide a display device which is capable of reducing or minimizing a crack of a substrate of a display panel which may be caused by the moisture permeation of the polarizing plate.

Objects of the present disclosure are not limited to the above-mentioned objects, and other objects, which are not mentioned above, can be clearly understood by those skilled in the art from the following descriptions.

In order to achieve the above-described objects and other limitations associated with the related art, according to an aspect of the present disclosure, a display device includes a back cover, a display panel disposed on the back cover, a polarizing plate disposed on the display panel, a barrier film disposed on the polarizing plate, and a side film which has one end disposed between the back cover and the display panel and another end disposed between the polarizing plate and the barrier film to enclose side surfaces of the display panel and the polarizing plate.

Other detailed matters of the exemplary embodiments are included in the detailed description and the drawings.

According to the present disclosure, a side film is disposed so as to enclose side portions of a display panel and a polarizing plate, thereby suppressing the moisture permeation.

According to the present disclosure, an inorganic layer and a substrate are disposed so as to enclose a side portion of the polarizing plate, thereby delaying the moisture permeation.

According to the present disclosure, a barrier film is disposed to cover an upper portion of the polarizing plate, thereby minimizing the moisture permeation.

According to the present disclosure, the moisture permeation of the polarizing plate is suppressed to reduce or minimize the warpage of the display panel and the crack of the substrate.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE EMBODIMENTS

Figure 1A:
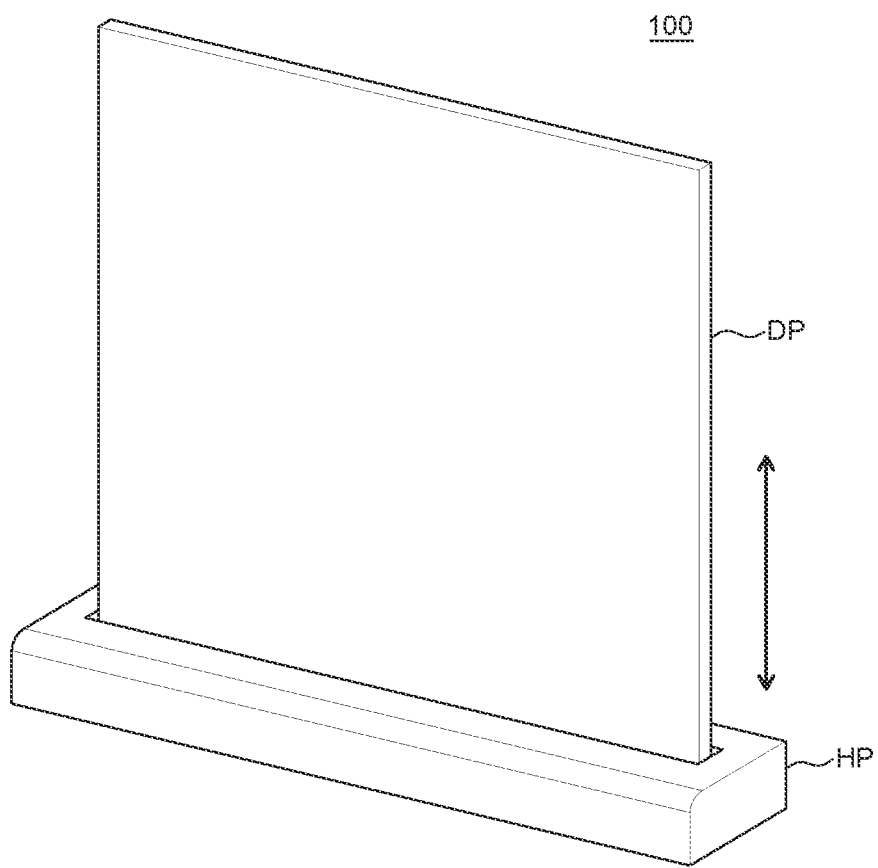
FIGS. 1A and 1B are perspective views of a display device according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts can be positioned between the two parts unless the terms are used with the term "immediately" or "directly".

When an element or layer is disposed "on" another element or layer, another layer or another element can be interposed directly on the other element or therebetween.

Although the terms "first", "second", and the like are used for describing various components, these components are not confined by these terms and may not define order. These terms are merely used for distinguishing one component from the other components. Therefore, a first component to be mentioned below can be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, exemplary embodiments of the present disclosure will be described in detail with reference to accompanying drawings.

<Display Device—A Rollable Display Device>

A rollable display apparatus can also be referred to as a display apparatus which is capable of displaying images even though the display apparatus is rolled. The rollable display apparatus can have a high flexibility as compared with a general display apparatus of the related art. Depending on whether to use a rollable display apparatus, a shape of the rollable display apparatus can freely vary. Specifically, when the rollable display apparatus is not used, the rollable display apparatus is rolled to be stored with a reduced volume. In contrast, when the rollable display apparatus is used, the rolled rollable display apparatus is unrolled to be used.

Figure 1B:
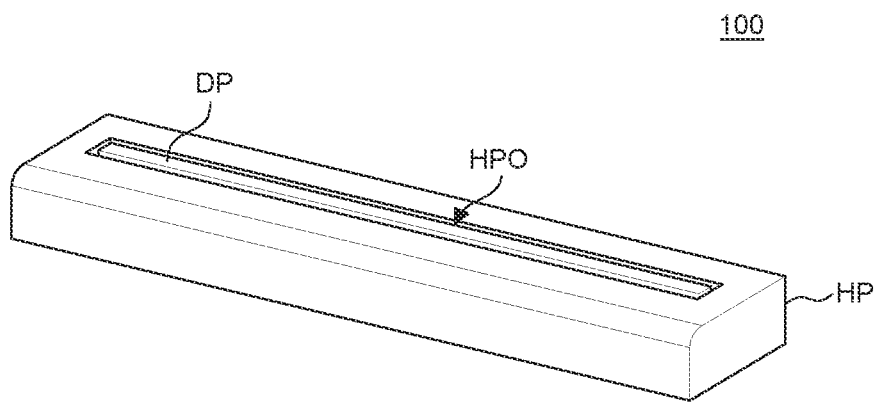

FIGS. 1A and 1B are perspective views of a display device according to an exemplary embodiment of the present disclosure. All the components of each display device according to all embodiments of the present disclosure are operatively coupled and configured.

Referring to FIGS. 1A and 1B, a display device 100 according to an exemplary embodiment of the present disclosure includes a display unit DP and a housing unit HP.

The display unit DP is a configuration for displaying images to a user for example, in the display unit DP, a display element and a circuit, a wiring line, a component, and the like for driving the display element can be disposed. In this case, since the display device 100 according to the exemplary embodiment of the present disclosure is a rollable display device, the display unit DP can be configured to be wound or unwound. For example, the display unit DP can be formed of a display panel and a back cover each having a flexibility to be wound or unwound. The display unit DP will be described below in more detail with reference to FIGS. 2A, 2B, 3 and 4.

The housing unit HP is a case in which the display unit DP is accommodated.

The housing unit HP has an opening HPO through which the display unit DP moves to the inside and the outside of the housing unit HP.

In the meantime, the display unit DP of the display device 100 can be switched from a fully unwound state as illustrated in FIG. 1A to a fully wound state as illustrated in FIG. 1B or from a fully wound state to a fully unwound state.

In order to switch the display unit DP to a fully unwound state or a fully wound state, a driving unit which winds or unwinds the display unit DP is disposed.

<Display Unit>

Figure 2A:
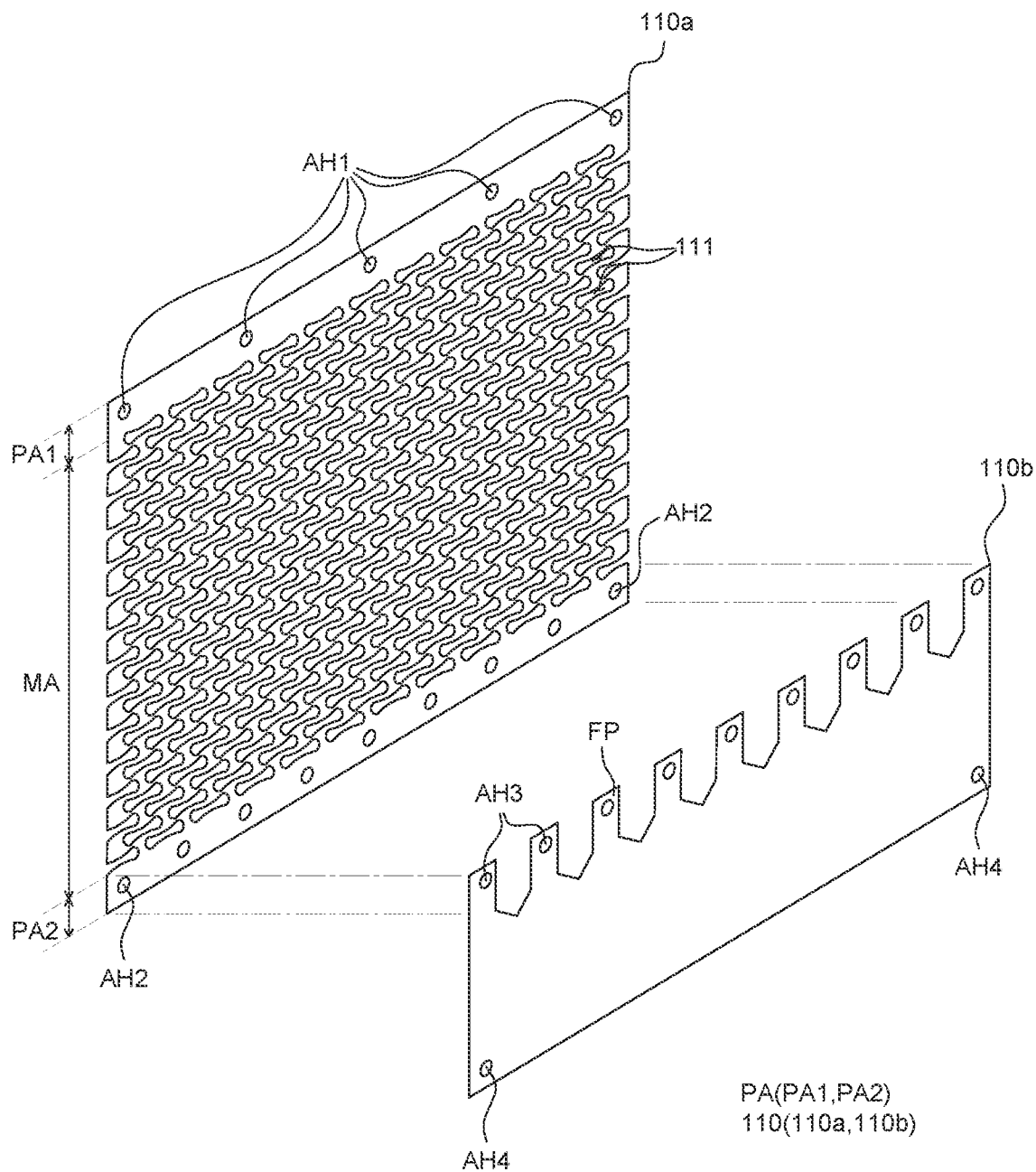
FIG. 2A is an exploded perspective view for explaining a first back cover and a second back cover of a display device according to an exemplary embodiment of the present disclosure.

FIG. 2A is an exploded perspective view for explaining a first back cover and a second back cover of a display device according to an exemplary embodiment of the present disclosure.

Figure 2B:
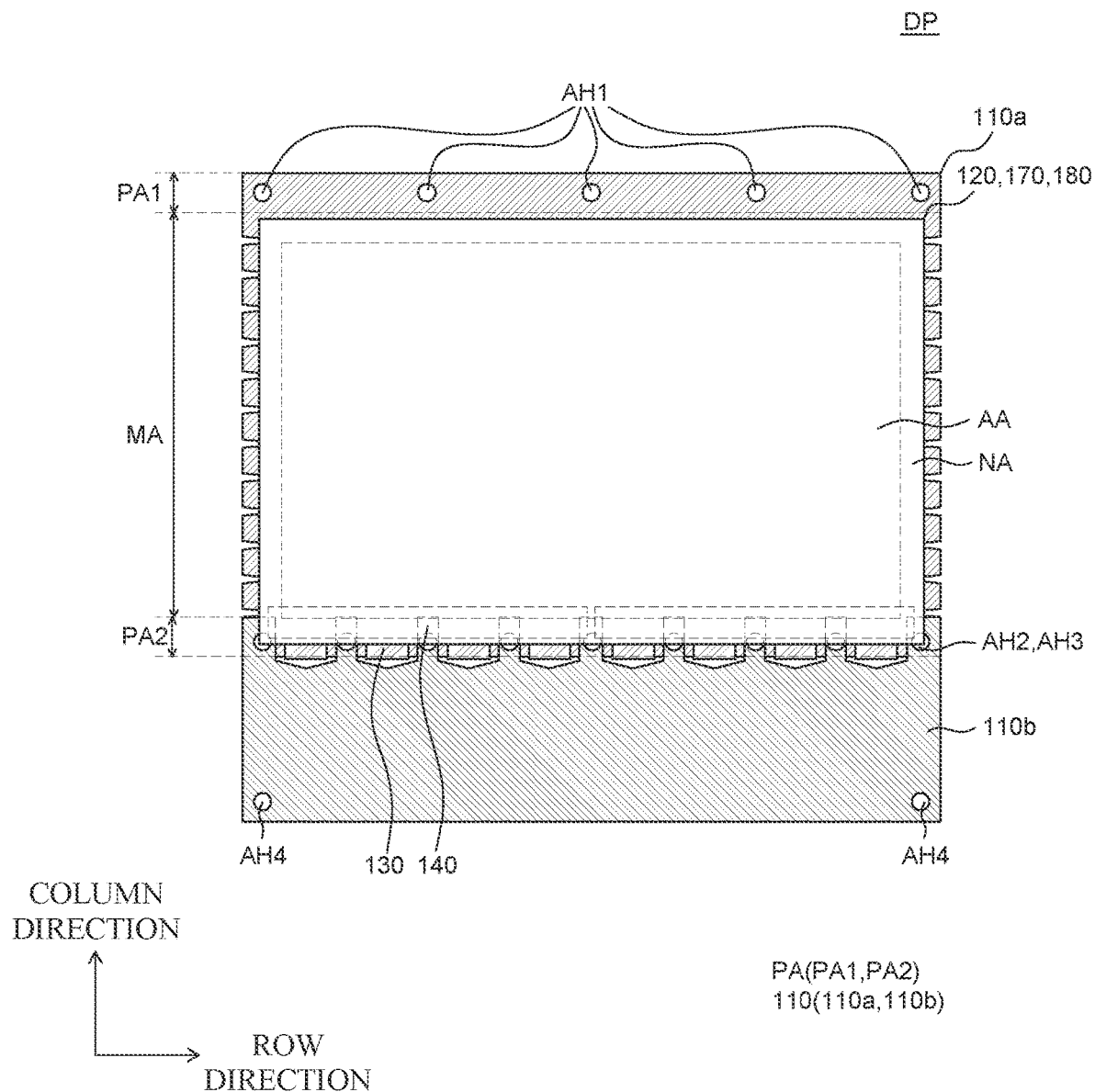
FIG. 2B is a plan view of a display unit of a display device according to an exemplary embodiment of the present disclosure.

FIG. 2B is a plan view of a display unit of a display device according to an exemplary embodiment of the present disclosure.

Referring to FIGS. 2A and 2B, the display unit DP includes a first back cover 110a, a second back cover 110b, a display panel 120, a plurality of flexible films 130, a printed circuit board 140, a polarizing plate 170, and a barrier film 180.

Referring to FIGS. 2A and 2B, the first back cover 110a is disposed on a rear surface of the display panel 120 to support the display panel 120. The first back cover 110a is disposed on a rear surface of the display panel 120 so that it is also referred to as a back cover and in this case, the second back cover 110b can be referred to as an extending sheet. A size of the first back cover 110a can be larger than a size of the display panel 120. The first back cover 110a can protect other configurations of the display unit DP from the outside.

The back covers 110a and 110b are disposed on rear surfaces of the display panel 120, the flexible film 130, and the printed circuit board 140 to support the display panel 120, the flexible film 130, and the printed circuit board 140.

In the meantime, the back cover 110a and 110b can be configured to be divided into a first back cover 110a and a second back cover 110b with respect to a portion where the plurality of fastening units FP is disposed, but is not limited thereto.

Even though the first back cover 110a is formed of a material having a rigidity, at least a part of the first back cover 110a can have a flexibility to be wound or unwound together with the display panel 120. For example, the first back cover 110a can be formed of a metal material such as steel use stainless or invar or plastic. However, if the material of the first back cover 110a satisfies physical conditions such as a thermal strain, a radius of curvature, and a rigidity, the material can be diversely changed depending on the design, and is not limited thereto.

The first back cover 110a can be fastened with a head bar and the second back cover 110b.

The first back cover 110a includes a plurality of support areas PA and a malleable area MA. The plurality of support areas PA is areas where a plurality of openings 111 is not disposed and the malleable area MA is an area where a plurality of openings 111 is disposed. Specifically, the first back cover 110*a* includes a first support area PA1, a malleable area MA, and a second support area PA2, and the first support area PA1, the malleable area MA, and the second support area PA2 are sequentially disposed from an uppermost end of the first back cover 110*a*. In this case, since the first back cover 110*a* is wound or unwound in a Y direction, the plurality of support areas PA and the malleable area MA can be disposed along the Y direction.

The first support area PA1 of the first back cover 110*a* is an uppermost area of the first back cover 110*a* and is fastened with the head bar. The first support area PA1 can include first fastening holes AH1 to be fastened with the head bar. For example, screws which pass through the head bar and the first fastening holes AH1 are disposed so that the head bar and the first support area PA1 are fastened with each other. Further, as the first support area PA1 is fastened with the head bar, when a link unit which is fastened with the head bar is lifted or lowered, the first back cover 110*a* is also lifted and lowered together and the display panel 120 which is attached to the first back cover 110*a* is also lifted and lowered together. Even though five first fastening holes AH1 are illustrated in FIGS. 2A and 2B, the number of first fastening holes AH1 is not limited thereto. Further, even though it has been described that the first back cover 110*a* is fastened with the head bar using the first fastening holes AH1, it is not limited thereto and the first back cover 110*a* and the head bar can be fastened with each other without using a separate fastening hole.

The malleable area MA of the first back cover 110*a* is an area which extends from the first support area PA1 to a lower side of the first back cover 110*a*. The malleable area MA is an area in which a plurality of openings 111 is disposed and the display panel 120 is attached. Specifically, the malleable area MA is an area which is wound around or unwound from the roller together with the display panel 120. The malleable area MA can overlap at least the display panel 120 among other configurations of the display unit DP.

The second support area PA2 of the first back cover 110*a* is an area which extends from the malleable area MA and is a lowermost side of the first back cover 110*a*. One end of the display panel 120 is disposed in the second support area PA2. For example, a pad area which is a non-active area at one end of the display panel 120 can be disposed in the second support area PA2.

Second fastening holes AH2 are disposed in the second support area PA2. The second fastening holes AH2 can be holes through which the cover unit, the second back cover 110*b*, and the first back cover 110*a* are fixed to each other. The cover unit is disposed in the second support area PA2 of the first back cover 110*a* to cover the printed circuit board 140 to protect the printed circuit board 140, but is not limited thereto. Even though nine second fastening holes AH2 are illustrated in FIG. 2A, the number of second fastening holes AH2 is illustrative and is not limited thereto.

In the meantime, in the first support area PA1 and the second support area PA2, the plurality of openings 111 as formed in the malleable area MA is not formed. Specifically, in the first support area PA1 and the second support area PA2, only the first fastening holes AH1 and the second fastening holes AH2 are formed, but the plurality of openings 111 as formed in the malleable area MA is not formed. Further, the first fastening holes AH1 and the second fastening holes AH2 have different shapes from that of the plurality of openings 111.

The first support area PA1 is an area fixed to the head bar and the second support area PA2 is an area where one end of the display panel 120, the plurality of flexible films 130, and the printed circuit board 140 are supported and has a rigidity larger than that of the malleable area MA. Further, as the first support area PA1 and the second support area PA2 have the rigidity, the first support area PA1 and the second support area PA2 can be firmly fixed to the head bar and the second back cover 110*b*. The second support area PA2 maintains the pad area at one end of the display panel 120 and the printed circuit board 140 to be flat to protect the pad area of the display panel 120 and the printed circuit board 140. Therefore, the display unit DP is fixed to the head bar of the driving unit to move to the inside or the outside of the housing unit in accordance with the operation of the driving unit and protect the pad area at one end of the display panel 120 and the printed circuit board 140.

In the meantime, in FIG. 2A, even though it is illustrated that the plurality of support areas PA and the malleable area MA of the first back cover 110*a* are sequentially disposed along the column direction, when the first back cover 110*a* is wound in the row direction, the plurality of support areas PA and the malleable area MA can be disposed along a row direction.

When the display unit DP is wound or unwound, the plurality of openings 111 disposed in the malleable area MA of the first back cover 110*a* can be deformed by a stress which is applied to the display unit DP. Specifically, when the display unit DP is wound or unwound, the malleable area MA of the first back cover 110*a* can be deformed as the plurality of openings 111 contracts or expands. Further, as the plurality of openings 111 contracts or expands, a slip phenomenon of the display panel 120 disposed on the malleable area MA of the first back cover 110*a* is minimized so that the stress which is applied to the display panel 120 can be minimized.

The second back cover 110*b* is fastened with the first back cover 110*a* and the roller to connect the first back cover 110*a* and the roller. The second back cover 110*b* connects the first back cover 110*a* and the roller by the above-described method and finally connects the display panel 120 disposed in the first back cover 110*a* to the roller. However, it is not limited thereto so that as long as the second back cover 110*b* is connected to the first back cover 110*a* and the roller, a shape or a connection method of the second back cover 110*b* can vary in various ways depending on the design and is not limited thereto.

One end of the second back cover 110*b* which is an uppermost area of the second back cover 110*b* can overlap one end of the first back cover 110*a*. For example, one end of the second back cover 110*b* can overlap the second support area PA2. One end of the second back cover 110*b* overlaps a part of the first back cover 110*a* to be connected or one end of the second back cover 110*b* is connected to the part of the first back cover 110*a* using a connection member, but is not limited thereto.

The second back cover 110*b* can include a plurality of fastening units FP overlapping the first back cover 110*a*. The plurality of fastening units FP is disposed at one end of the second back cover 110*b*. Further, in the plurality of fastening units FP, a plurality of third fastening holes AH3 to be fastened with the first back cover 110*a* can be disposed. The plurality of fastening units FP in which the plurality of third fastening holes AH3 is disposed is spaced apart from each other and a space which allows the plurality of flexible films 130 to be bent can be ensured between the plurality of fastening units FP. The third fastening holes AH3 can be holes through which the cover unit to be described below and the second back cover 110*b* are fixed to each other. Even though nine third fastening holes AH3 are illustrated in FIG. 2A, the number of third fastening holes AH3 is illustrative and is not limited thereto.

In FIG. 2A, it is described that the second fastening holes AH2 and the third fastening holes AH3 to be fastened with the cover unit and the first back cover 110a and the second back cover 110b are disposed in the second support area PA2 of the first back cover 110a and one end of the second back cover 110b, respectively. However, the first back cover 110a, the second back cover 110b, and the cover unit can be fixed to each other without using a separate fastening hole.

In the meantime, when the second support area PA2 and the plurality of fastening units FP are wound around the roller 161, an outer circumferential surface of the roller which overlaps the second support area PA2 and the plurality of fastening units FP can be a flat portion. Therefore, the second support area PA2 can always maintain the flat state regardless of the wound or unwound state to the roller and the pad area at one end of the display panel 120 and the printed circuit board 140 disposed in the second support area PA2 can also maintain the flat state.

An area from one end to the other end of the second back cover 110b is an area which extends to dispose the active area AA of the display panel 120 at the outside of the housing unit. For example, when the first back cover 110a and the display panel 120 are fully unwound, an area from the other end of the second back cover 110b which is fixed to the roller to one end of the second back cover 110b in which the plurality of flexible films 130 and the printed circuit board 140 are disposed can be disposed in the housing unit. The malleable area MA and the first support area PA1 in which the active area AA of the display panel 120 is disposed can be disposed at the outside of the housing unit. For example, an area from the other end of the second back cover 110b fixed to the roller to at least a part of one end of the second back cover 110b and the second support area PA2 can be disposed in the housing unit.

The other end of the second back cover 110b is a lowermost area of the second back cover 110b and is fastened with the roller. A fourth fastening hole AH4 can be formed at the other end of the second back cover 110b to be fastened with the roller. For example, a fastening member which passes through the roller and the fourth fastening holes AH4 is disposed to fasten the roller and the other end of the second back cover 110b with each other. Further, as the other end of the second back cover 110b is fastened with the roller, the display panel 120, the first back cover 110a, and the second back cover 110b can be wound around or unwound from the roller. Even though two fourth fastening holes AH4 are illustrated in FIG. 2A, the number of fourth fastening holes AH4 is not limited thereto.

In the meantime, in the second back cover 110b, the plurality of openings 111 as formed in the malleable area MA of the first back cover 110a is not formed. Specifically, only the third fastening holes AH3 and the fourth fastening holes AH4 are formed at one end and the other end of the second back cover 110b, but the plurality of openings 111 as formed in the malleable area MA of the first back cover 110a is not formed. Further, the third fastening hole AH3 and the fourth fastening hole AH4 have different shapes from that of the plurality of openings 111.

The second back cover 110b can be formed of a flexible material to be wound around or unwound from the roller. For example, the second back cover 110b can be formed of a plastic material such as PET. However, if the material of the second back cover 110b satisfies physical conditions such as a thermal strain, a radius of curvature, and a rigidity, the material can be diversely changed depending on the design, and is not limited thereto.

Even though in the present specification, it is described that the first back cover 110a and the second back cover 110b are separately formed, it is not limited thereto so that the first back cover 110a and the second back cover 110b can be integrally formed.

Referring to FIG. 2B, the display panel 120 is disposed on one surface of the first back cover 110a. The display panel 120 is disposed in the malleable area MA, on one surface of the first back cover 110a. The display panel 120 is a panel for displaying images to a user. The display panel 120 can include a display element which displays images, a driving element which drives the display element, and wiring lines which transmit various signals to the display element and the driving element.

The display element can be defined in different manners depending on the type of the display panel 120. For example, when the display panel 120 is an organic light emitting display panel 120, the display element can be an organic light emitting diode which includes an anode, an organic light emitting layer, and a cathode. For example, when the display panel 120 is a liquid crystal display panel, the display element can be a liquid crystal display element. Hereinafter, even though the display panel 120 is assumed as an organic light emitting display panel, the display panel 120 is not limited to the organic light emitting display panel. Further, since the display device 100 according to the exemplary embodiment of the present disclosure is a rollable display device 100, the display panel 120 can be implemented as a flexible display panel 120 to be wound around or unwound from the roller.

The display panel 120 includes an active area AA and a non-active area NA.

The active area AA is an area where images are displayed in the display panel 120. In the active area AA, a plurality of sub pixels which configures the plurality of pixels and a driving circuit for driving the plurality of sub pixels can be disposed. The plurality of sub pixels is minimum units which configure the active area AA and a display element can be disposed in each of the plurality of sub pixels. For example, an organic light emitting diode which includes an anode, an organic light emitting layer, and a cathode can be disposed in each of the plurality of sub pixels, but it is not limited thereto. Further, a driving circuit for driving the plurality of sub pixels can include a driving element, a wiring line, and the like. For example, the driving circuit can be configured by a thin film transistor, a storage capacitor, a gate line, a data line, and the like, but is not limited thereto.

The non-active area NA is an area where no image is displayed. In the non-active area NA, various wiring lines, circuits, and the like, for driving the organic light emitting diode of the active area AA are disposed. For example, in the non-active area NA, a link line which transmits signals to the plurality of sub pixels and driving circuits of the active area AA or a driving IC such as a gate driver IC or a data driver IC can be disposed, but the non-active area is not limited thereto.

In the meantime, the non-active area NA includes a pad area.

The pad area is an area in which a plurality of pads is disposed. The plurality of pads is electrodes which electrically connect the plurality of flexible films 130 and the display panel 120 to each other so that the plurality of flexible films 130 and the display panel 120 are electrically connected by the plurality of pads. The pad area can be a non-active area NA which overlaps the second support area PA2 of the first back cover 110a in the non-active area NA. However, the pad area can be formed in the other part of the non-active area NA depending on the placement of the plurality of flexible films 130, but is not limited thereto.

Referring to FIG. 2B, a plurality of flexible films 130 is disposed at one end of the display panel 120. The plurality of flexible films 130 is films in which various components are disposed on a base film 131 having a softness to supply a signal to the plurality of sub pixels which configures the plurality of pixels of the active area AA and the driving circuits and is electrically connected to the display panel 120. One ends of the plurality of flexible films 130 are disposed in the non-active area NA of the display panel 120 to supply a power voltage, a data voltage, or the like, to the plurality of sub pixels and the driving circuits of the active area AA. In the meantime, even though eight flexible films 130 are illustrated in FIG. 2B, the number of flexible films 130 can vary depending on the design, but is not limited thereto.

A driving IC such as a gate driver IC or a data driver IC can be disposed on the base films of the plurality of flexible films 130. The driving IC is a component which processes data for displaying images and a driving signal for processing the data. The driving IC can be disposed by a chip on glass (COG), a chip on film (COF), a tape carrier package (TCP) technique, or the like, depending on a mounting method.

In the meantime, the plurality of flexible films 130 is components in which a base film, data for displaying images on the base film, and various driving ICs which control data are disposed to display images. The plurality of flexible films 130 is electrically connected to the pad area at one end of the display panel 120 to be bent toward a rear surface of the first back cover 110a. One ends of the plurality of flexible films 130 are connected to one end of the display panel 120 on one surface of the first back cover 110a, and the other ends of the plurality of flexible films 130 can be disposed on an opposite surface of the one surface of the first back cover 110a.

Referring to FIG. 2B, the printed circuit board 140 is disposed on the rear surface of the first back cover 110a to be connected to the plurality of flexible films 130. For example, the printed circuit board 140 is disposed on the rear surface of the first back cover 110a to be electrically connected to the plurality of flexible films 130. The printed circuit board 140 is a component which supplies signals to the driving IC of the plurality of flexible films 130. Various components can be disposed in the printed circuit board 140 to supply various signals such as a driving signal or a data signal to the driving IC. In the meantime, even though two printed circuit boards 140 are illustrated in FIG. 2B, the number of printed circuit boards 140 can vary depending on the design and is not limited thereto.

<Placement of Barrier Film and Side Film>

Figure 3:
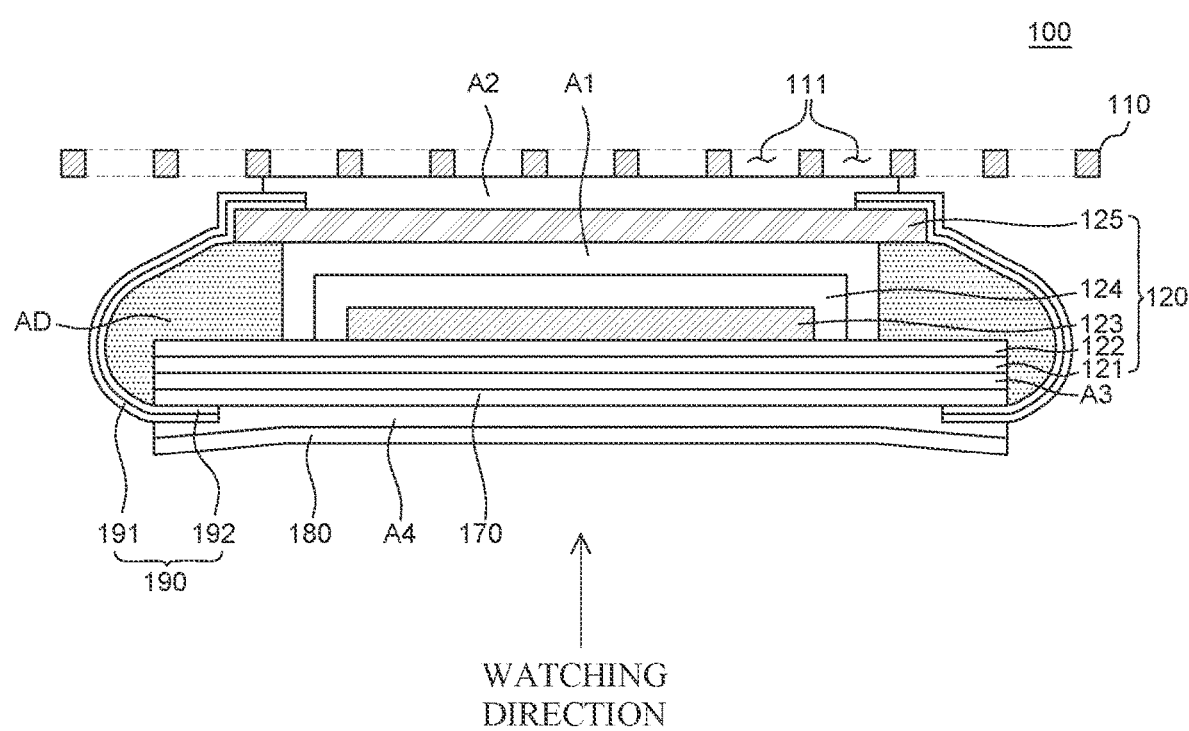
FIG. 3 is a cross-sectional view of a display unit of a display device according to an exemplary embodiment of the present disclosure.

FIG. 3 is a cross-sectional view of a display unit of a display device according to an exemplary embodiment of the present disclosure.

Referring to FIG. 3, the back cover 110 is disposed on the rear surface of the display panel 120 and the polarizing plate 170 and the barrier film 180 can be disposed on the front surface of the display panel 120. Here, the front surface of the display panel 120 can refer to a surface corresponding to the watching direction and the rear surface of the display panel 120 can refer to a surface opposite to the watching direction, but is not limited thereto.

The display panel 120 can include a substrate 121, an inorganic layer 122, a pixel unit 123, an encapsulation layer 124, and an encapsulation substrate 125.

The substrate 121 is a base member which supports various components of the display panel 120 and can be configured by an insulating material. The substrate 121 can be formed of a material having a flexibility to allow the display panel 120 to be wound or unwound and for example, can be formed of a plastic material such as polyimide (PI).

The inorganic layer 122 can suppress moisture and/or oxygen which penetrates from the outside of the substrate 121 from being spread. At least one inorganic layer 122 can be configured by a single layer or a double layer of silicon oxide (SiOx) and silicon nitride (SiNx), but is not limited thereto. For example, the inorganic layer can be a single-layered buffer layer formed of silicon oxide.

The pixel unit 123 can include a plurality of organic light emitting diodes and a circuit for driving the organic light emitting diodes. The pixel unit 123 can be an area corresponding to the active area AA. The plurality of pixels is disposed in a matrix and each of the plurality of pixels includes a plurality of sub pixels SP. Each of the plurality of sub pixels SP is an individual unit which emits light and in each of the plurality of sub pixels SP, an organic light emitting diode is disposed. The organic light emitting diode can include an anode, an organic light emitting layer, and a cathode.

The anode can supply holes to the organic light emitting layer and be formed of a conductive material having a high work function. For example, the anode can be formed of tin oxide (TO), indium tin oxide (ITO), indium zinc oxide (IZO), indium zinc tin oxide (ITZO), or the like, but is not limited thereto.

The organic light emitting layer is supplied with holes from the anode and supplied with electrons from the cathode to emit light. The organic light emitting layer can be formed of a red organic light emitting layer, a green organic light emitting layer, a blue organic light emitting layer, a white organic light emitting layer, and the like depending on a color of light emitted from the organic light emitting layer. In this case, when the organic light emitting layer is a white organic light emitting layer, color filters having various colors can be additionally disposed.

The cathode can supply electrons to the organic light emitting layer and be formed of a conductive material having a low work function. For example, the cathode can be formed of any one or more selected from a group consisting of metals, such as magnesium (Mg), silver (Ag), and aluminum (Al), and an alloy thereof, but is not limited thereto.

In the meantime, the display panel 120 can be configured by a top emission type or a bottom emission type, depending on an emission direction of light which is emitted from the organic light emitting diode.

According to the top emission type, light emitted from the organic light emitting diode is emitted to an upper portion of the substrate 121 on which the organic light emitting diode is formed. In the case of the top emission type, a reflective layer can be formed below the anode to allow the light emitted from the organic light emitting diode to travel to the upper portion of the substrate 121, for example, toward the cathode.

According to the bottom emission type, light emitted from the organic light emitting diode is emitted to a lower portion of the substrate 121 on which the organic light emitting diode is formed. In the case of the bottom emission type, the anode can be formed only of a transparent conductive material and the cathode can be formed of the metal material having a high reflectance to allow the light emitted from the organic light emitting diode to travel to the lower portion of the substrate 121.

Hereinafter, for the convenience of description, the description will be made by assuming that the display device 100 according to an exemplary embodiment of the present disclosure is a bottom emission type display device, but it is not limited thereto.

A circuit for driving the organic light emitting diode is disposed in the pixel unit 123. The circuit can be formed of a thin film transistor, a storage capacitor, a gate line, a data line, a power line, and the like, but it can vary in various forms depending on the design of the display device 100.

The encapsulation layer 124 which covers the pixel unit 123 can be disposed on the pixel unit 123. The encapsulation layer 124 seals the organic light emitting diode of the pixel unit 123. The encapsulation layer 124 can protect the organic light emitting diode of the pixel unit 123 from moisture, oxygen, impacts, and the like of the outside. The encapsulation layer 124 can be formed by alternately laminating a plurality of inorganic layers and a plurality of organic layers. For example, the inorganic layer can be formed of an inorganic material such as silicon nitride SiNx, silicon oxide SiOx, and aluminum oxide AlOx and the organic layer can be formed of epoxy-based or acrylic-based polymer, but they are not limited thereto.

The encapsulation substrate 125 can be disposed on the encapsulation layer 124. The encapsulation substrate 125 protects the organic light emitting diode together with the encapsulation layer 124. The encapsulation substrate 125 can protect the organic light emitting diode of the pixel unit 123 from moisture, oxygen, impacts, and the like of the outside. The encapsulation substrate 125 can be formed of a metal material, which has a high corrosion resistance and is easily processed in the form of a foil or a thin film, such as aluminum (Al), nickel (Ni), chromium (Cr), and an alloy material of iron (Fe) and nickel. Therefore, as the encapsulation substrate 125 is formed of a metal material, the encapsulation substrate 125 can be implemented by an ultra-thin film and have a high resistance against external impacts and scratches.

A first adhesive layer A1 can be disposed between the encapsulation layer 124 and the encapsulation substrate 125. The first adhesive layer A1 can bond the encapsulation layer 124 and the encapsulation substrate 125 to each other. The first adhesive layer A1 is formed of a material having an adhesiveness and can be a thermosetting or natural curing adhesive. For example, the first adhesive layer A1 can be formed of an optical clear adhesive (OCA), a pressure sensitive adhesive (PSA), or the like, but is not limited thereto.

In the meantime, the first adhesive layer A1 can be disposed so as to enclose the encapsulation layer 124 and the pixel unit 123. For example, the pixel unit 123 can be sealed by the buffer layer 122 and the encapsulation layer 124, and the encapsulation layer 124 and the pixel unit 123 can be sealed by the buffer layer 122 and the first adhesive layer A1. The first adhesive layer A1 can protect the organic light emitting diode of the pixel unit 123 from moisture, oxygen, impacts, and the like of the outside together with the encapsulation layer 124 and the encapsulation substrate 125. In this case, the first adhesive layer A1 can further include an absorbent. The absorbent can be particles having hygroscopicity and absorb moisture and oxygen from the outside to minimize permeation of the moisture and oxygen into the pixel unit 123.

The back cover 110 can be disposed on the encapsulation substrate 125. The back cover 110 is disposed to be in contact with the encapsulation substrate 125 of the display panel 120 to protect the display panel 120. In order to protect the display panel 120, the back cover 110 can be formed of a material having a rigidity.

A second adhesive layer A2 can be disposed between the encapsulation substrate 125 and the back cover 110. The second adhesive layer A2 can bond the encapsulation substrate 125 and the back cover 110 to each other. The second adhesive layer A2 is formed of a material having an adhesiveness and can be a thermosetting or natural curing adhesive. For example, the adhesive layer A2 can be formed of an optical clear adhesive (OCA), a pressure sensitive adhesive (PSA), or the like, but is not limited thereto.

A third adhesive layer A3 can be disposed between the display panel 120 and the polarizing plate 170. The third adhesive layer A3 can bond the display panel 120 and the polarizing plate 170 to each other. The third adhesive layer A3 is formed of a material having an adhesiveness and can be a thermosetting or natural curing adhesive. For example, the third adhesive layer A3 can be formed of an optical clear adhesive (OCA), a pressure sensitive adhesive (PSA), or the like, but is not limited thereto. Even though in FIG. 3, the third adhesive layer A3 and the polarizing plate 170 are illustrated as separated components, it is not limited thereto and the third adhesive layer A3 can be a component of the polarizing plate 170.

The polarizing plate 170 can be disposed on the front surface of the display panel 120. The polarizing plate 170 is a configuration which suppresses external light incident onto the display device 100 from being reflected to be visible. The polarizing plate 170 can be formed with a structure in which a plurality of layers is laminated.

The polarizing plate 170 can include a phase retardation layer, a first protective layer, a polarization layer, a second protective layer, and a surface layer.

The phase retardation layer can have a transmissive axis of −45 degrees or +45 degrees with respect to an angle at which the polarization layer polarizes external light. Therefore, the external light which is incident on the phase retardation layer passes through the phase retardation layer to be circularly polarized.

The polarization layer can linearly polarize light which is incident from the outside of the display device. Therefore, the polarization layer can be formed of an oriented film of a polyvinyl alcohol (PVA)-based polymer film containing iodine or dichroic dye, but is not limited thereto.

The first protective layer and the second protective layer can be disposed on both surfaces of the polarization layer. The polarization layer is formed of a polyvinyl alcohol-based material which absorbs moisture well so that the first protective layer and the second protective layer are disposed on both surfaces of the polarization layer to suppress the damage of the polarization layer to be caused by heat or moisture. The first protective layer and the second protective layer can be formed of a material which does not have a phase difference so as not to affect the polarization state of the polarization layer. For example, the first protective layer and the second protective layer can be formed of a material such as triacetyl cellulose (TAC), but is not limited thereto.

The surface layer is disposed at the outermost side of the polarizing plate 170 to enhance a mechanical strength of the polarizing plate 170 and perform anti-glare and anti-reflection functions so that the visibility of the display device can be improved. The surface layer can be formed with a film formed by a surface processing method, such as an anti-glare (AG) layer, a semi-glare (SG) layer, a low-reflection (LR) layer, and an anti-glare and low-reflection (AGLR) layer, but is not limited thereto.

Generally, the polarizing plate of the display device includes a polyvinyl alcohol (PVA)-based polymer film for polarization of the incident light as a polarization layer. However, when the polyvinyl alcohol (PVA)-based polymer material is exposed to the moisture, a modulus can be lowered. By doing this, a neutral plane of the display panel is shifted to increase a stress of the substrate, which can result in the crack of the substrate.

Further, the polyvinyl alcohol (PVA)-based polymer material is formed of a material having a good hygroscopicity, so that the volume changes in accordance with the humidity. For example, the polarization layer absorbs moisture in an environment having a high humidity to expand and discharges moisture in an environment having a low humidity to be contracted. Therefore, a warpage is generated in the extending direction of the polarization layer and thus, the warpage is also generated on the polarizing plate and the display panel to which the polarizing plate is attached.

However, in the display device 100 according to the exemplary embodiment of the present disclosure, the barrier film 180 is disposed on the polarizing plate 170 and the side film 190 is disposed so as to enclose the side surfaces of the display panel 120 and the polarizing plate 170 to delay the moisture permeation. Hereinafter, the barrier film 180 and the side film 190 will be described in more detail.

The barrier film 180 can be disposed on the front surface of the polarizing plate 170. The barrier film 180 can minimize the warpage on the front surface of the polarizing plate 170 which may be caused by the moisture permeation. The barrier film 180 can be configured by a polymer resin having a characteristic which is light and unbreakable. For example, the barrier film 180 can be configured by cyclo olefin polymer (COP), but is not limited thereto and can also be configured by a material such as polyimide (PI), poly carbonate (PC), and polyethylene terephthalate (PET).

A fourth adhesive layer A4 can be disposed between the barrier film 180 and the polarizing plate 170. The fourth adhesive layer can bond the barrier film 180 and the polarizing plate 170 to each other. The fourth adhesive layer A4 is formed of a material having an adhesiveness and can be a thermosetting or natural curing adhesive. For example, the fourth adhesive layer A4 can be formed of an optical clear adhesive (OCA), a pressure sensitive adhesive (PSA), or the like, but is not limited thereto. Even though in FIG. 3, the fourth adhesive layer A4 and the barrier film 180 are illustrated as separated components, it is not limited thereto and the fourth adhesive layer A4 can be a component of the barrier film 180.

The side film 190 can be disposed on side surfaces of the display panel 120 and the polarizing plate 170. One end and the other end of the side film 190 can extend in a direction perpendicular to the roller. For example, one end of the side film 190 is disposed between the back cover 110 and the display panel 120 to extend so as to enclose the side surface of the display panel 120 and the other end can be disposed between the polarizing plate 170 and the barrier film 180. For example, side portions of the display panel 120 and the polarizing plate 170 can be sealed by the side film 190. The side film 190 can protect the side surfaces of the display panel 120 and the polarizing plate 170 from moisture, oxygen, impacts, and the like from the outside.

One end of the side film 190 can be disposed between the back cover 110 and the display panel 120 by the second adhesive layer A2. The other end of the side film 190 can be disposed between the polarizing plate 170 and the barrier film 180 by the fourth adhesive layer A4.

The side film 190 is configured by two layers of a base layer 191 and a barrier layer 192. For example, the base layer 191 can be configured by cyclo olefin polymer (COP), but is not limited thereto and can also be configured by a material such as polyethylene terephthalate (PET). For example, the barrier layer 192 can be formed of an inorganic film or an organic film, but is not limited thereto. Here, the base layer 191 of the side film 190 is disposed at the outside to absorb the impact of the outside and the barrier layer 192 of the side film 190 can be disposed at the inside to be in contact with the adhesive member AD. Therefore, the base layer 191 at one end of the side film 190 is disposed to be adjacent to the back cover 110 and the base layer 191 at the other end of the side film 190 is disposed to be adjacent to the barrier film 180.

The adhesive member AD can be disposed between the side film 190 and the display panel 120 or between the side film 190 and the polarizing plate 170. The side film 190 can be attached to the side surface of the display panel 120 or a side surface or a part of a top surface of the polarizing plate 170. The adhesive member AD can be formed of a photo-curable acrylic resin, etc., but is not limited thereto.

Accordingly, in the display device 100 according to the exemplary embodiment of the present disclosure, the barrier film 180 is disposed on the top surface of the polarizing plate 170 to protect the front surface of the polarizing plate 170 from the moisture, the oxygen, the impacts, and the like of the outside. Further, the side film 190 is disposed so as to enclose the side surfaces of the display panel 120 and the polarizing plate 170 to completely seal the side surfaces of the display panel 120 and the polarizing plate 170. The side surfaces of the display panel 120 and the polarizing plate 170 which are not protected by the barrier film 180 are also sealed by the side film 190 so that the permeation of the moisture or oxygen can be minimized. Accordingly, the warpage of the polarizing plate 170 in accordance with moisture absorption is minimized, the warpage of the display panel 120 to which the polarizing plate 170 is attached is also minimized, and the reliability of the display device 100 can be improved.

<Deformation of Inorganic Layer and Substrate>

Figure 4:
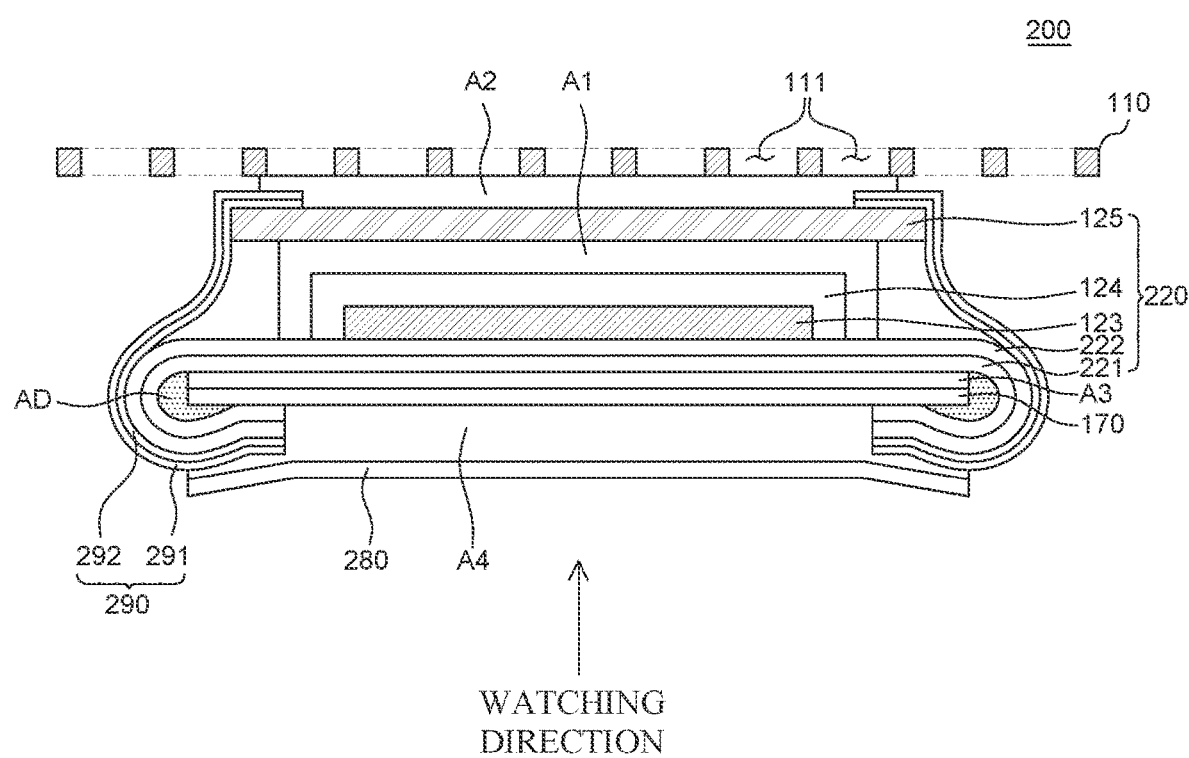
FIG. 4 is a cross-sectional view of a display unit of a display device according to another exemplary embodiment of the present disclosure.

FIG. 4 is a cross-sectional view of a display unit of a display device according to another exemplary embodiment of the present disclosure.

Except for the configuration of a side film 290, a substrate 221, an inorganic layer 222, and an adhesive member AD, the configuration of a display device 200 of FIG. 4 is substantially the same as the display device 100 of FIG. 3 so that a redundant description will be omitted or may be briefly provided.

Referring to FIG. 4, the display panel 220 can include a substrate 221, an inorganic layer 222, a plurality of pixel units 123, an encapsulation layer 124, and an encapsulation substrate 125. The back cover 110 is disposed on the rear surface of the display panel 220 and the polarizing plate 170 and the barrier film 280 can be disposed on the front surface of the display panel 220. Here, both ends of the substrate 221 and the inorganic layer 222 extend to be bent so as to be disposed between the polarizing plate 170 and the barrier film 290. Even though in FIG. 4, the inorganic layer 222 is illustrated as a single layer, it is not limited thereto and the inorganic layer can be one or more layers. Therefore, the substrate 221 and the inorganic layer 222 are disposed on the side surfaces of the display panel 220 and the polarizing plate 170 to protect the side surfaces of the display panel 220 and the polarizing plate 170 from the moisture, the oxygen, the impacts, and the like of the outside.

As illustrated in FIG. 4, the substrate 221, the inorganic layer 222, and the side film 290 are bent and the side film 290 can be disposed so as to enclose the substrate 221 and the inorganic layer 222. In the bending area, the side film 290 is disposed at the outermost side, the substrate 221 is disposed in the innermost side, and the inorganic layer 222 is disposed between the side film 290 and the substrate 221. One end of the substrate 221 can be disposed so as to be adjacent to a part of the top surface of the polarizing plate 170. Here, an adhesive member AD can be disposed between the substrate 221 and the polarizing plate 170. The substrate 221 can be attached to the side surface and a part of the top surface of the polarizing plate 170 through the adhesive member AD. Accordingly, the side surface of the polarizing plate 170 can be sealed by the substrate 221, the inorganic layer 222, and the side film 290 to be protected from the moisture, the oxygen, the impacts, and the like of the outside.

The side film 290 is configured by two layers of a base layer 291 and a barrier layer 292. For example, the base layer 291 can be configured by cyclo olefin polymer (COP), but is not limited thereto and can also be configured by a material such as polyethylene terephthalate (PET). For example, the barrier layer 292 can be formed of an inorganic film or an organic film, but is not limited thereto. Here, the base layer 291 of the side film 290 is disposed at the outside to absorb the impact of the outside and the barrier layer 292 of the side film 290 can be disposed at the inside to be in contact with the inorganic layer 222.

Accordingly, in the display device 200 according to another exemplary embodiment of the present disclosure, the barrier film 280 is disposed on the top surface of the polarizing plate 170 to protect the front surface of the polarizing plate 170 from the moisture, the oxygen, the impacts, and the like of the outside. In the meantime, the side surface of the polarizing plate 170 can be sealed by the substrate 221, the inorganic layer 222, and the side film 290 to be protected from the moisture, the oxygen, the impacts, and the like of the outside. Further, the side film 290 is disposed so as to enclose the side surface of the display panel 220 to minimize the permeation of the moisture or oxygen into the side surface of the display panel 220. Accordingly, the display panel 220 and the polarizing plate 170 can be protected from the absorption of the moisture, the warpage issue of the polarizing plate 170 and the display panel 220 can be effectively addressed, and the reliability of the display device 200 can be improved.

The exemplary embodiments of the present disclosure can also be described as follows:

According to an aspect of the present disclosure, there is provided a display device. The display device includes a back cover, a display panel disposed on the back cover, a polarizing plate disposed on the display panel, a barrier film disposed on the polarizing plate and a side film which has one end disposed between the back cover and the display panel and another end disposed between the polarizing plate and the barrier film to enclose side surfaces of the display panel and the polarizing plate.

The side film can include a base layer and a barrier layer on the base layer.

The base layer between the base layer and the barrier layer can be disposed at an outside from the side surfaces of the display panel and the polarizing plate.

The display device can further include an adhesive member disposed between the display panel and the polarizing plate and the side film.

The display panel can include a substrate and at least one inorganic layer disposed on the substrate and the substrate and the inorganic layer can be bent such that one ends can be disposed between the polarizing plate and the barrier film.

In an area in which the substrate and the inorganic layer can be bent, the side film can be disposed so as to enclose the substrate and the inorganic layer.

The display device can further include an adhesive member disposed between one end of the bent substrate and the polarizing plate.

The adhesive member can be disposed between the polarizing plate and the one end of the bent substrate from a top surface to a side surface of the polarizing plate.

The display device can further include a roller which can be connected to the back cover to wind or unwind the back cover and the display panel.

The display device can further include an encapsulation layer disposed on the inorganic layer and an encapsulation substrate which can be disposed on the encapsulation layer through a first adhesive layer.

The display device can further include a second adhesive layer disposed between the encapsulation substrate and the back cover.

The display device can further include a third adhesive layer disposed between the display panel and the polarizing plate.

The display device can further include a fourth adhesive layer disposed between the barrier film and the polarizing plate.

The other end of the side film can be disposed between the polarizing plate and the fourth adhesive layer.

One ends of the bent substrate and inorganic layer can be disposed between the polarizing plate and the fourth adhesive layer.

One end of the side film can be disposed between the back cover and the encapsulation substrate.

The base layer can be configured by cyclo olefin polymer (COP) or polyethylene terephthalate (PET) and the barrier layer can be configured by an inorganic film or an organic film.

Although the exemplary embodiments of the present disclosure have been described in detail with reference to the accompanying drawings, the present disclosure is not limited thereto and can be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto.

Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:
1. A display device, comprising:
a back cover;
a display panel disposed on the back cover;
a polarizing plate disposed on the display panel;
a barrier film disposed on the polarizing plate; and a side film which has one end disposed between the back cover and the display panel and another end disposed between the polarizing plate and the barrier film so as to enclose side surfaces of the display panel and the polarizing plate.

2. The display device according to claim 1, wherein the side film includes a base layer and a barrier layer on the base layer.

3. The display device according to claim 2, wherein the base layer between the base layer and the barrier layer is disposed at an outside from the side surfaces of the display panel and the polarizing plate.

4. The display device according to claim 1, further comprising:
   an adhesive member disposed between the display panel and the polarizing plate and the side film.

5. The display device according to claim 1, wherein the display panel includes a substrate and at least one inorganic layer disposed on the substrate, and
   the substrate and the at least one inorganic layer are bent so that one ends are disposed between the polarizing plate and the barrier film.

6. The display device according to claim 5, wherein in an area in which the substrate and the at least one inorganic layer are bent, the side film is disposed so as to enclose the substrate and the at least one inorganic layer.

7. The display device according to claim 5, further comprising:
   an adhesive member disposed between one end of the bent substrate and the polarizing plate.

8. The display device according to claim 7, wherein the adhesive member is disposed between the polarizing plate and the one end of the bent substrate from a top surface to a side surface of the polarizing plate.

9. The display device according to claim 1, further comprising:
   a roller which is connected to the back cover to wind or unwind the back cover and the display panel.

10. The display device according to claim 5, further comprising:
    an encapsulation layer disposed on the at least one inorganic layer; and
    an encapsulation substrate which is disposed on the encapsulation layer through a first adhesive layer.

11. The display device according to claim 10, further comprising:
    a second adhesive layer disposed between the encapsulation substrate and the back cover.

12. The display device according to claim 11, further comprising:
    a third adhesive layer disposed between the display panel and the polarizing plate.

13. The display device according to claim 12, further comprising:
    a fourth adhesive layer disposed between the barrier film and the polarizing plate.

14. The display device according to claim 13, wherein another end of the side film is disposed between the polarizing plate and the fourth adhesive layer.

15. The display device according to claim 14, wherein one ends of the bent substrate and inorganic layer are disposed between the polarizing plate and the fourth adhesive layer.

16. The display device according to claim 10, wherein one end of the side film is disposed between the back cover and the encapsulation substrate.

17. The display device according to claim 2, wherein the base layer is configured by cyclo olefin polymer (COP) or polyethylene terephthalate (PET), and
    the barrier layer is configured by an inorganic film or an organic film.

\* \* \* \* \*